US011125211B2

(12) United States Patent
Abbaszadeh et al.

(10) Patent No.: US 11,125,211 B2
(45) Date of Patent: Sep. 21, 2021

(54) SYSTEM AND METHOD FOR WIND TURBINE MULTIVARIABLE CONTROL USING STATE DEPENDENT QUADRATIC REGULATOR

(71) Applicant: General Electric Company, Schenectady, NY (US)

(72) Inventors: Masoud Abbaszadeh, Clifton Park, NY (US); Fabiano Daher Adegas, São Paulo (BR); Fernando Javier D'Amato, Niskayuna, NY (US); Junqiang Zhou, Schenectady, NY (US); Conner Shane, Glenville, NY (US); Justin Barton, Glenville, NY (US)

(73) Assignee: General Electric Company, Schenectady, NY (US)

( * ) Notice: Subject to any disclaimer, the term of this patent is extended or adjusted under 35 U.S.C. 154(b) by 100 days.

(21) Appl. No.: 16/414,484

(22) Filed: May 16, 2019

(65) Prior Publication Data

US 2020/0362819 A1 Nov. 19, 2020

(51) Int. Cl.
 *F03D 7/04* (2006.01)
 *G05B 13/02* (2006.01)
 (Continued)

(52) U.S. Cl.
 CPC ............ *F03D 7/045* (2013.01); *F03D 7/028* (2013.01); *G05B 13/0205* (2013.01); (Continued)

(58) Field of Classification Search
 CPC .......... F03D 7/045; F03D 7/028; G06F 30/20; G05B 13/0205; G06N 7/00
 (Continued)

(56) References Cited

U.S. PATENT DOCUMENTS

| 6,244,536 B1 | 6/2001 | Cloutier |
| 6,768,927 B2 | 7/2004 | Krogmann |

(Continued)

FOREIGN PATENT DOCUMENTS

| CN | 102410138 A | 4/2012 |
| EP | 1710654 B1 | 3/2009 |

OTHER PUBLICATIONS

Boyu (State Dependent Riccati Equation Based Rotor-Side Converter Control for Doubly Fed Wind Generator; Received Apr. 3, 2018, accepted May 15, 2018, date of publication May 22, 2018, date of current version Jun. 19, 2018) (Year: 2018).*

(Continued)

*Primary Examiner* — Jigneshkumar C Patel
(74) *Attorney, Agent, or Firm* — Dority & Manning, P.A.

(57) ABSTRACT

A system for wind turbine control includes a state dependent quadratic regulator (SDQR) control unit, a linear quadratic regulator (LQR) generating control acceleration commands for wind turbine speed and wind turbine power regulation, an actuator dynamic model computing a gain value for the LQR at predetermined sampling intervals and augmenting the actuator dynamic model with a wind turbine model. The wind turbine model either an analytical linearization model or a precomputed linear model, where the precomputed linear model is selected from a model bank based on a real-time scheduling operation, and the analytical linearization model is computed using an online linearization operation in real-time at time intervals during operation of the wind turbine based on current wind turbine operating point values present at about the time of linearization. A method and a non-transitory medium are also disclosed.

20 Claims, 4 Drawing Sheets

(51) Int. Cl.
  G05B 13/04 (2006.01)
  G06F 30/20 (2020.01)
  F03D 7/02 (2006.01)
  G06N 7/00 (2006.01)
(52) U.S. Cl.
  CPC ........... *G05B 13/04* (2013.01); *G05B 13/041* (2013.01); *G06F 30/20* (2020.01); *G06N 7/00* (2013.01)
(58) Field of Classification Search
  USPC .......................................................... 700/287
  See application file for complete search history.

(56) References Cited

U.S. PATENT DOCUMENTS

| | | | |
|---|---|---|---|
| 7,363,094 | B2 | 4/2008 | Kumar |
| 7,772,713 | B2 | 8/2010 | Huang et al. |
| 7,805,205 | B2 | 9/2010 | Santos |
| 7,883,317 | B2 | 2/2011 | Ormel et al. |
| 9,058,028 | B2 | 6/2015 | Kim et al. |
| 9,366,230 | B2 | 6/2016 | Perley et al. |
| 2007/0068210 | A1 | 3/2007 | Pittner et al. |
| 2013/0302161 | A1 | 11/2013 | Koerber et al. |
| 2014/0178195 | A1 | 6/2014 | Blom et al. |
| 2014/0271181 | A1 | 9/2014 | Perley et al. |
| 2015/0369136 | A1* | 12/2015 | Karpman ............... G05B 17/02 700/275 |

OTHER PUBLICATIONS

Burkart (Nonlinear Control of Wind Turbines: An Approach Based on Switched Linear Systems and Feedback Linearization: 2011 50th IEEE Conference on Decision and Control and European Control Conference (CDC-ECC) Orlando, FL, USA, Dec. 12-15, 2011). (Year: 2011).*

Soliman (Multiple Model MIMO Predictive Control for Variable Speed Variable Pitch Wind Turbines, 2010 American Control Conference Marriott Waterfront, Baltimore, MD, USA, Jun. 30-Jul. 2, 2010). (Year: 2010).*

Jason (Control of Wind Turbines: Past, Present, and Future, 2009 American Control Conference Hyatt Regency Riverfront, St. Louis, MO, USA Jun. 10-12, 2009) (Year: 2009).*

Trung-Kien (NPL: LQR Control fora Multi-MW Wind Turbine; World Academy of Science, Engineering and Technology 62 2012) (Year: 2012).*

Barias (NPL: Model predictive control for wind turbines with distributed active flaps: incorporating inflow signals and actuator constraints, Published online Nov. 17, 2011 in Wiley Online Library (wileyonlinelibrary.com). DOI: 10.1002/we.503) (Year: 2011).*

Sang Ko (IEEE: Power Quality Control of Wind-Hybrid Power Generation System Using Fuzzy-LQR Controller, IEEE Transactions On Energy Conversion, vol. 22, No. 2, Jun. 2007) (Year: 2007).*

Soliman, M. et al., "Multiple Model MIMO Predictive Control for Variable Speed Variable Pitch Wind Turbines", American Control Conference Marriott Waterfront, 2010, (pp. 2778-2784, 7 total pages).

Pham, Trung-Kien et al., "LQR Control for a Multi-MW Wind Turbine", World Academy of Science, Engineering and Technology, International Journal of Mechanical and Mechatronics Engineering, vol. 6, Issue: 02, 2012, (pp. 507-512, 6 total pages).

Hur, S. et al., "Model Predictive and Linear Quadratic Gaussian Control of a Wind Turbine", Optimal Control Applications and Methods, DOI: 10.1002/0ca.2244, (pp. 88-111, 24 total pages).

Parrott Edward et al: "A robust adaptive control scheme for underactuated non-linear systems", 2018 Annual IEEE International Systems Conference (SYSCON), IEEE, Apr. 23, 2018 (Apr. 23, 2018), pp. 1-5.

Heer Flavio et al: "Model based power optimization of wind farms", 2014 European Control Conference (ECC), EUCA, Jun. 24, 2014 (Jun. 24, 2014), pp. 1145-1150.

EPO Search Report, dated Sep. 23, 2020.

* cited by examiner $$J = \int (y^T Q_o y + u^T R_o u + \dot{u}^T S_o \dot{u} + \ddot{u}^T T_o \ddot{u}) dt$$

$y = Cx,$ augmented plant - actuator model: $D = 0$ $$\bar{Q}_{xx}(t) = C(t)^T Q_o C(t)$$

$$h(y) = |y_i - y_i^{lim}| \leq 0 \Rightarrow z \triangleq \nabla h(y) \dot{y} = 0$$

$$J_h = \int z^T W(z) z \, dt:$$

$$J = \int (x^T Q_{xx} x + u^T R u + x^T N u + \dot{u}^T S \dot{u} + \ddot{u}^T T \ddot{u}) dt$$

$$N(t) = A^T C^T W C B$$

$$R(t) = R_o + B^T C^T W C B$$

$$Q_{xx}(t) = \bar{Q}_{xx}(t) + A^T C^T W C A$$

$$W = \begin{bmatrix} w_1 & \cdots & 0 \\ \vdots & \ddots & 0 \\ 0 & 0 & w_{n_y} \end{bmatrix}, \; w_i = \left( \frac{1}{1 + \gamma (y_i - y_i^{lim})^2} \right)$$

$$x = \begin{bmatrix} x_{turbine} & x_{actuator} \end{bmatrix}$$

$$\tilde{x} = [x \; u \; \dot{u}]$$

$$\tilde{u} = \ddot{u}$$

FIG. 3

Inputs:
  Estimated state $\hat{x}_t$, disturbance $\hat{d}_t$, and output $\hat{y}_t$ at sampling t, predicted controls $u_{t-1|k}$ for k=1,..., N at sampling t-1.

Outputs:
  Actuator control commands $u_t$, and predicted controls $u_{t|k}$ for k = 0,..., N -1 at sampling t.

// Linearize dynamic turbine model:
Set $x_{t|0} = \hat{x}_t$ and $y_{t|0} = \hat{y}_t$
for k = 0 to N -1 do
  1. Define operating point ($u_{t-1|k+1}$, $x_{t|k}$, $y_{t|k}$), and evaluate the plant and actuator models at the operating point (either from analytically linearized model or plant model bank scheduling);
  2. Discretize continuous time model to obtain discrete state space representation of the system given by matrices ($A_k, B_k, F_k, C_k, D_k, G_k$);
  3. Update predicted state/output:
$$x_{t|k+1} = A_k x_{t|k} + B_k u_{t-1|k+1} + F_k$$
$$y_{t|k+1} = C_k x_{t|k+1} + D_k u_{t-1|k+1} + G_k$$
end for // Build quadratic program(QP):
The unconstrained finite horizon optimal control for output tracking is formulated as follows:

$$\min_{U = [u_{t|0},...,u_{t|N-1}]^T} \frac{1}{2} y_{t|N}^T P y_{t|N} + \frac{1}{2} \sum_{k=0}^{N-1} \left( y_{t|k}^T Q_y y_{t|k} + u_{t|k}^T R_u u_{t|k} \right)$$

$$x_{t|k+1} = A_k x_{t|k} + B_k u_{t|k} + F_k,$$
$$y_k = C_k x_{t|k} + G_k, \quad k = 0, ..., N-1$$

The dynamic optimization is converted into a quadratic programming problem of the form $$\min_U \frac{1}{2} U^T H U + (x_0^T F + C_f) U$$

by following the steps as below:
for k = 0 to N -1 do
$$x_{t|k+1} = S_x^k x_0 + S_u^k U + S_f^k$$
$$y_{t|k} = C_k S_x^{k-1} x_0 + C_k S_u^{k-1} U + C_k S_f^{k-1} + G_k$$

Where the state update matrices are:
$$S_x^k = A_k A_{k-1} \cdots A_0$$
$$S_u^k = [A_k A_{k-1} \cdots A_1 B_0 \ \cdots \ A_k B_{k-1} \ B_k \cdots 0]$$
$$S_f^k = A_k A_{k-1} \cdots A_1 F_0 + \ldots + A_k F_{k-1} + F_k,$$
end for // Solve optimization problem:
$$U = -H^{-1}(x_0^T F + C_f)^T$$

Pseudo code for finite horizon LQR (unconstrained MPC)

FIG. 4

SYSTEM AND METHOD FOR WIND TURBINE MULTIVARIABLE CONTROL USING STATE DEPENDENT QUADRATIC REGULATOR

BACKGROUND

Operational performance of a wind turbine generator is subject to external conditions such as wind speed, wind shear, and other environmental factors. These external conditions can have a direct impact on the blade pitch, turbine rotational velocity, and can introduce vibrations into the tower or the blades. These disturbances can alter the wind turbine power generation level, stability, efficiency, and other performance metrics.

The wind turbine is a highly dynamic and coupled system with intertwined control design constraints and performance criteria. Conventional wind turbine controllers consist of multiple single input/single output (SISO) loops, with sometimes competing and contradicting design objectives. Each SISO can access a few shared actuators. As a result, there is no guarantee that the control signal commanded by each individual SISO loop is materialized. This loss of control signal can often lead to underperforming operation and pitch constraint violations.

BRIEF DESCRIPTION OF THE DRAWINGS

FIG. 3 depicts weighting matrices generated using tuning methods in accordance with embodiments; and FIG. 4 depicts pseudocode for a multiple input/multiple output wind turbine control algorithm in accordance with embodiments.

DESCRIPTION

Figure 1:
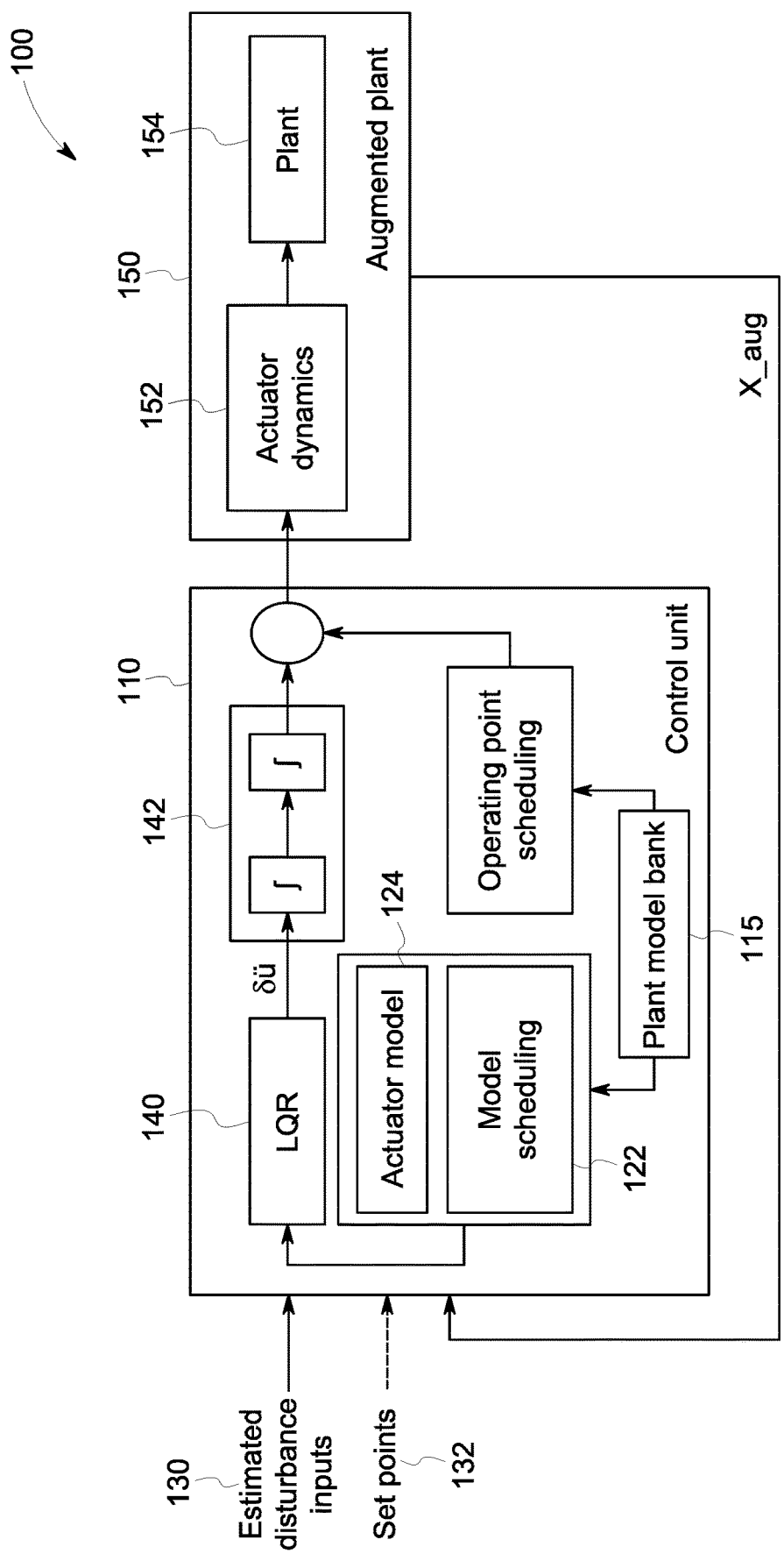
FIG. 1 schematically depicts a wind turbine control system architecture in accordance with embodiments, with linear model bank scheduling.

Embodying systems and methods provide a systematic and unified method for control design of a wind turbine using a consolidated multivariable controller implementing a multiple input/multiple output (MIMO) control approach. Use of a consolidated multivariable controller provides a simplified control architecture with increased performance over conventional approaches implementing SISO loops with multiple actuators.

Embodiments determine control commands from the MIMO inputs by implementing an optimal linear multivariable State Dependent Quadratic Regulator (SDQR) control unit based on a state dependent Riccati approach. At the core of the SDQR is a Linear Quadratic Regulator (LQR) whose gain is computed online at every sampling time through real-time solution of a Discrete-time Algebraic Riccati Equation (DARE). In accordance with embodiments, the time horizon can be selectable by a user.

The SDQR control unit is formulated as an output-weighting regulator with additional weightings on control input rates and accelerations. A recursive Riccati solver may be used for computational efficiency. In some implementations embodying wind turbine control systems can work with a prestored bank of linearized models scheduled in real-time; in other implementations embodying wind turbine control systems can work with a linear model computed using online linearization in real time (i.e., linearization occurs at time intervals during and responsive to operation of the wind turbine). The control system can consider a wide range of operational and performance constraints including structural loading (such as wind turbine tower and blade vibration constraints), actuator constraints (e.g., blade pitch angle and generator torque), and speed and power regulation or setpoint tracking performance specifications.

Embodying wind turbine control systems implementing linear model bank scheduling are provided with a bank of linearized models prestored and scheduled in real-time (e.g., by wind speed and azimuth angle parameters). The current operating point is also scheduled at sampling time. This approach uses a bank of linear models that are computed offline and stored in the system for real-time scheduling. The granularity of the bank is set by predetermined model accuracy and resolution. As an example, a linear model may be computed for every 10 degrees of azimuth angle (thus 36 models per revolution), for every 1 m/s of wind speed, for the wind speed range from 5 m/s to 25 m/s, resulting in 36*21=765 linear models. This approach is useful when there is enough memory available to store the bank.

Embodying wind turbine control systems implementing online model linearization derive an analytic linearization based on evaluating in real-time sampling points at a selectable interval based on the current operating point values for the wind turbine. This approach is useful when analytical form of linearization is available, and the embodying system includes a control unit with enough computational power to evaluate the model in real time.

In both cases, the linearized model has the following linear dynamic state space form:

$$\dot{x} = A(x,\theta)x + B(x,\theta)u + B_d(x,\theta)d$$

$$y = C(x,\theta)x + D(x,\theta)u + D_d(x,\theta)d$$

Where $\dot{x}$ are the wind turbine states (turbine degrees of freedom); u is the set of control inputs (e.g., individual blade pitch angles and generator torque); d are the disturbances (e.g., wind parameters (speed, shear, etc.); and y are the model outputs, which may be a combination of measured outputs and other outputs selected for control. The state space matrices are time-varying and may depend on states and/or some parameters (e.g., some estimated wind parameters). For example, if the state space matrices are scheduled by azimuth angle and wind speed, the model turns into the following form:

$$\delta\dot{x} = A(\psi,\hat{\omega})\delta x + B(\psi,\hat{\omega})\delta u + B_d(\psi,\hat{\omega})\delta d, x = \delta x + x_{op}$$

$$\delta\dot{y} = C(\Psi,\hat{\omega})\delta x + D(\Psi,\hat{\omega})\delta u + D_d(\Psi,\hat{\omega})\delta d, y = \delta y + y_{op}$$

$$\delta d = \omega - \hat{\omega}, u = \delta u + u_{op}$$

In this example, azimuth angle is a model state and wind speed is an input disturbance parameter.

If the original nonlinear plant model of the wind turbine is developed in continuous-time—e.g., through physics-based modeling, then the linearized models are discretized at each sampling time before being used by the LQR. For the case of analytic linearization, an analytical discretization may be computed offline (for example, by symbolic computation methods) and prestored in the system to be evaluated in real-time.

FIG. 1 schematically depicts a wind turbine control system architecture 100 in accordance with embodiments. FIG. 1 depicts control system 100 with a linear model bank scheduling implementation. SDQR control unit 110 includes a processor unit and a memory unit that can store executable instructions, which when executed by the processor unit cause the processor unit to perform a unified method for control design of a wind turbine in accordance with embodiments. The memory unit can provide the control processor with local cache memory. SDQR control unit 110 also includes linear model plant bank 115 for the wind turbine 154 (also "plant" herein). The plant bank 115 is precomputed and stored in the system.

In order to schedule the bank, an estimate of the disturbance parameters 130 that are used in the state space matrices are needed—e.g., a wind speed estimate. The actuator dynamic model 124 (pitch and torque actuators) is augmented with the scheduled model 122 of the wind turbine and is used to compute the LQR gain at every sampling time. The SDQR control unit is a state feedback controller, meaning that it assumes the availability of the plant states either by direct measurement or through an observer such a Kalman filter.

The LQR control unit 140 is formulated such that it generates control acceleration commands. This enables the state feedback controller to have weighting on the control signal rates and accelerations. The LQR cost function is shown below, in which Q, R, S and T are tuning matrices to be designed.

LQR Controller cost function:

$$\int y'Qy + u'Ru + \dot{u}'S\dot{u} + \ddot{u}'T\ddot{u} \quad (1)$$

The control acceleration commands undergo a double integration stage 142 to get the control commands. Since the LQR unit is designed upon a linearized model around an operating point, these control commands are essentially the perturbations around the current operating point. The LQR unit can regulate turbine speed and power around certain levels (LQR regulation) or it can receive power and speed set-points 132 to track (LQR servomechanism).

The control acceleration commands are calculated as the following:

$$\delta\ddot{u} = K(t)\delta x_{aug}$$

$$\delta x_{aug} = x_{aug} - x_{aug}^{op}$$

Where K(t) is the time-varying LQR gain calculated by solving an algebraic Riccati equation for sampling time periods. The current operating point is also time-varying and is scheduled in a similar fashion as the state space matrices. The total control commands are computed by adding control perturbation commands to the current operating point. These commands are sent to the actuators, which passing the actuator dynamics 152, will actuate the plant 154.

If the true actuator dynamics is nonlinear, its linear approximation is used in the model used by the LQR unit. Unlike the Linear Parameter-Varying (LPV) and gain scheduling control conventional approaches in which a bank of controllers is computed offline and scheduled in real-time, embodiments compute a bank of models offline and schedule the model online.

Figure 2:
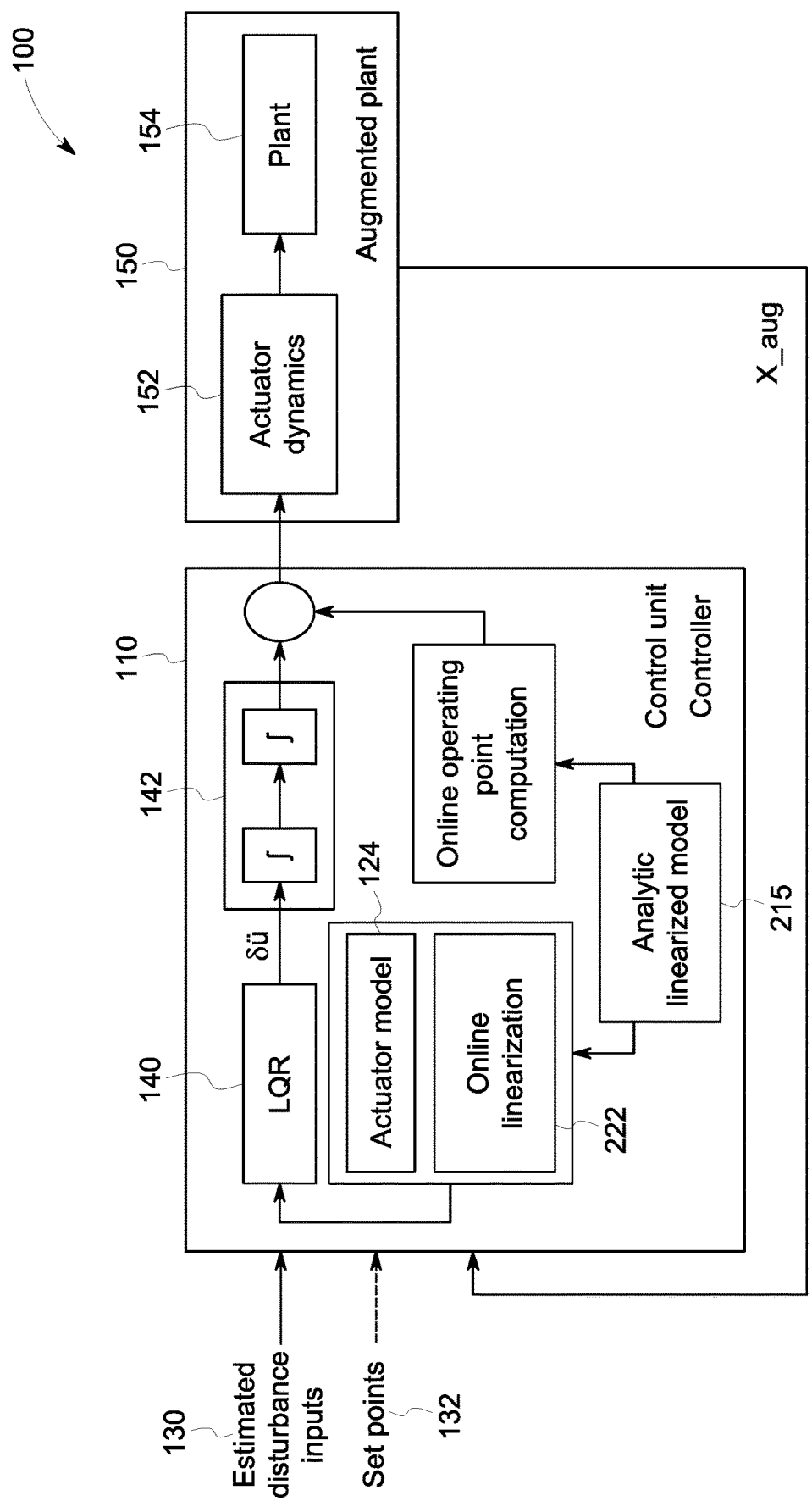
FIG. 2 schematically depicts the wind turbine control system architecture of FIG. 1 in accordance with embodiments, with online model linearization.

FIG. 2 schematically depicts the wind turbine control system architecture 100 in accordance with embodiments. FIG. 2 depicts control system 100 with a linear model bank scheduling implementation. Control system 100 performs a real-time evaluation of an analytical linearization model 215 that is computed and prestored offline; as opposed to storing a model bank 115 of precomputed linear models selected based on scheduling. In some embodiments, the current operating point can be computed by evaluation of an analytical form as well. The actuator dynamic model 124 is augmented with online linearization 222 based on evaluating in real-time sampling points.

The controller tuning parameters of the SDQR include the Q, R, S and T matrices as shown in (1). The tuning of the SDQR parameters can be done by a simulation-based approach or by an implicit model following approach.

Simulation-Based Controller Tuning

In the simulation-based approach, the controller is tuned using closed-loop simulations and performance evaluations, based on sensitivities and trial and error. In this approach the tuning matrices may be selected to be diagonal, with each diagonal element normalized to its maximum value (known from the system constraints), as follows:

$$Q = \begin{bmatrix} \frac{q_1}{y_1^{max}} & & \\ & \ddots & \\ & & \frac{q_{n\_x}}{y_{n\_y}^{max}} \end{bmatrix}, R = \begin{bmatrix} \frac{r_1}{u_1^{max}} & & \\ & \ddots & \\ & & \frac{r_{n\_u}}{u_{n\_u}^{max}} \end{bmatrix},$$

$$S = \begin{bmatrix} \frac{s_1}{\dot{u}_1^{max}} & & \\ & \ddots & \\ & & \frac{s_{n\_u}}{\dot{u}_{n\_u}^{max}} \end{bmatrix}, T = \begin{bmatrix} \frac{t_1}{\ddot{u}_1^{max}} & & \\ & \ddots & \\ & & \frac{t_{n\_u}}{\ddot{u}_{n\_u}^{max}} \end{bmatrix}$$

The scalar parameters on the numerator of each diagonal elements are tuned through closed loop simulations. A priority order may be selected to achieve the right trade-off between competing criteria. For example, the following priority design method may be used:

LQR with output weighting;
Input magnitude, rate and acceleration weighting;
Model is scheduled or analytically evaluated at every sampling point;
DARE solved online at every sampling point;
Output priority order: Generator Speed; Generator Power; Blade Flap; Tower fore-aft (FA); D, Q moments; Tower side-to-side (SS); and Blade Edge.

To evaluate different performance criteria and assess the sensitivity of the design criteria to the tuning parameter, pareto charts may be used. To reduce the dimensionality of the pareto charts in the multivariable space, the evaluation criteria may be clustered into three categories: loads, performance (e.g., speed and power regulation/tracking) and control commands. For each category, features such as maximum (e.g., extreme loads, power/speed overshoot) and variance may be evaluated for each simulation scenario, such as in (2).

$$J_{loads}^{VAR} = \max\{J_{MYTB}^{VAR}, J_{MRB}^{VAR}, J_D^{VAR}, J_Q^{VAR}, J_{M=R0}^{VAR}\}$$

$$J_{perf}^{VAR} = \max\{J_{P_{gen}}^{VAR}, J_\omega^{VAR}, -J_{AEP}^{VAR}\}$$

$$J_{control}^{VAR} = \max\{J_{T_{gen}}^{VAR}, J_{\dot{T}_{gen}}^{VAR}, J_\theta^{VAR}, J_{\dot{\theta}}^{VAR}, J_{\ddot{\theta}}^{VAR}\} \quad (2)$$

Simulation scenarios were performed by a Design-of-Experiments (DoE) over the tuning parameters and other factors such as wind speeds, wind horizontal and vertical shears, and turbulence intensities. The simulation of stochastic wind profiles was repeated with different random seeds (e.g., a Monte Carlo simulation). Pareto tradeoffs were made between the normalized Tower Fore-Aft (Tower FA) load peak and standard deviation vs. those of the turbine power and speed. Embodying systems and methods simulation result showed that Tower FA extreme load can be reduced by about 4% with compromising of only less than 1% in power regulation performance, and less than 0.1% of speed regulation performance.

Implicit Model Following Controller Tuning

Under the implicit model following approach, a desired closed-loop dynamic model is selected, and the controller is tuned to achieve the prescribed closed-loop dynamics. The desired closed-loop dynamics is specified for the augmented plant-actuator open-loop system. Note that the augmented plant 150 is always strictly proper, so no D matrix. The cost function may be defined over the error between the closed-loop dynamics of the regulated output and their desired dynamics (see below). The terms associated with control input (and its derivatives) weighting may also be added to the cost function as in (1).

open loop (plant + actuator)
$$\begin{cases} \dot{x} = Ax + Bu \\ y = Cx \\ z = Hx \\ \dot{z} = HAx + HBu \end{cases}$$

desired closed loop
$$\dot{x}_d = A_d x_d$$
$$z_d = H x_d \rightarrow \dot{z}_d = H A_d x_d$$
$$e = \dot{z}_d - \dot{z} \Rightarrow J = \int_0^\infty (e^T Q_Z e + u^T R_u u) dt$$

Where, y is measurement data;
z are the regulated outputs;
$x_d$ is the state vector of the desired dynamics;
$z_d$ is the desired output response; and
error (e) is minimized between the closed loop output response and the desired output response.

The desired dynamics may be prescribed as the desired damping and natural frequency of each degree of freedom. This leads to an analytical form for the Q and R weighting matrices with structured weights simplifying the numerical solution of the Riccati equation. This provides a systematic approach for tuning, and significantly reduces the required effort required when tuning based on trial and error. The optional weights Qz and Ru may be used for scaling or further fine tuning or may be chosen to be identity for simplicity. The weighing matrices S and T may be tuned using simulations as in the simulation-based approach.

Tuning parameters can include a predetermined damping and natural frequency for each mode; input weighting of Ru; and, optionally, Qz (e.g., Qz=diag(1/z_max)) for scaling. The weighting matrices are structured and computed analytically where $\xi_i$ and $\omega_i$, i=1, . . . , n are the desired closed loop damping ratio and natural frequency of each mode:

$$Q = (A - A_d)^T H^T Q_Z H (A - A_d)$$
$$R = B^T H^T Q_Z H B + R_u$$
$$N = (A - A_d)^T H^T Q_Z H B$$

$$A_d = \begin{bmatrix} 0 & I_n \\ -\text{diag}(\omega_i^2) & -\text{diag}(2\xi_i \omega_i) \end{bmatrix}$$
desired closed loop $\xi_i$ and $\omega_i$ for each mode The simulation-based tuning method is used if a desired closed-loop dynamic is not available and/or is hard to prescribe. A combination of both simulation-based and implicit model following approaches can also be used. For example, one could specify the closed-loop dynamics for certain degrees of freedoms and tune the rest experimentally.

Adaptive Tuning:

FIG. 3 depicts weighting matrices 300 generated using tuning methods in accordance with embodiments. Embodiments address the varying operating conditions and wind disturbances by computing the weighting matrices using, for example, either of the two aforementioned tuning methods. These weighting matrices can be considered as the nominal weights and adapted online as indicated in FIG. 3. The weights $w_i$ are adaptively changing depending on the corresponding outputs distance to their limits, using inverse quadratic radial basis functions with a tuning parameter γ.

In accordance with adaptive tuning, the weights on constrains that are far from their boundary limits can be relaxed and the weights of those constraints that are getting close to their boundary limits can be increased inverse of their distance to their boundaries. As an example, a simulation of the pitch command and the generator speed during a 1-year extreme operating gust with and without adaptive tuning was performed. The simulation demonstrated that adaptive tuning can prevent pitch rate violation, in the expense of 5 rpm increase in the speed, which is still well within its limit (1650+−10%).

(MPC) provides a way to solve the optimal control problem in a receding time window. This is achieved by solving a finite time-horizon optimization, but only implementing the solution at current time step and then optimizing again, repeatedly. The main difference between MPC and LQR is that it solves the optimization problem in a finite horizon, and that it takes into account the time varying dynamics in future time window, which makes MPC have a better ability to anticipate future events and take control actions accordingly.

The MPC approach relies upon a physics-based dynamic model to predict the change in the system along the prediction window. For the sake of computational simplification, the nonlinear model is approximated with a time-varying linear affine model around a trajectory along the prediction window consisting of the system's inputs, states and outputs.

Such a trajectory is generated from model-based simulation, based upon the current state value and predicted control actions from previous step. This requires an analytically linearized model and enough computational power to evaluate the model multiple times and solve the optimization problem in real time.

FIG. 4 depicts pseudocode for a multiple input/multiple output wind turbine control algorithm 400 in accordance with embodiments. The pseudocode illustrates the steps of how the linear time-varying model is obtained online, and how the optimization is built and solved to get the control action. In addition, the control algorithm 400 assumes the availability of the plant states and the knowledge of the disturbances to initialize the prediction, and that they can be achieved through an estimator such as a Kalman filter.

Block 410 determines the current model state by executing a simulation solution using the model most recent prior time step to obtain a model for the next prediction horizon. Block 420 builds a quadratic programming problem by applying an unconstrained MPC for output tracking. Block 430 converts the dynamic optimization into a quadratic programming problem by solving a minimization problem. Block 440 solves the optimization problem.

Finite Horizon LQR (Unconstrained MPC)

The formulation and method presented for the infinite horizon LQR can be adapted for finite horizon LQR. The finite horizon denomination comes from replacing the infinite horizon cost function $$\int y'Qy + u'Ru + \dot{u}'S\dot{u} + \ddot{u}'T\ddot{u}$$

by a finite horizon counterpart, which can adopt the following form $$y_N^t P y_N + \sum_{k=1}^{N-1} y_k^t Q y_t + u_k^t R u_k$$

This formulation has important practical implications because it considers the behavior only in the immediate prediction horizon and can be very effective to handle the behavior of the turbine in the future few seconds of operations. The approach using this cost function is also known as unconstrained model predictive control. The calculation of the associated control action (described in FIG. 4), differs from the Riccati approach used for the inifinite horizon LQR. However, the methods for control tuning, selection of the weight matrices are applicable to this case.

Using the finite horizon LQR, constraints can be incorporated by adding corresponding penalty terms in the cost function. One of the key advantages of using this approach instead of a formulation with explicit inequality constraints is that the solution can be obtained without expensive iterative algorithms and be computed in as described in algorithm 400.

In accordance with some embodiments, a computer program application stored in non-volatile memory or computer-readable medium (e.g., register memory, processor cache, RAM, ROM, hard drive, flash memory, CD ROM, magnetic media, etc.) may include code or executable program instructions that when executed may instruct and/or cause a controller or processor to perform methods discussed herein such as a unified method for control design of a wind turbine using a consolidated multivariable controller implementing a MIMO) control approach, as disclosed above.

The computer-readable medium may be a non-transitory computer-readable media including all forms and types of memory and all computer-readable media except for a transitory, propagating signal. In one implementation, the non-volatile memory or computer-readable medium may be external memory.

Although specific hardware and methods have been described herein, note that any number of other configurations may be provided in accordance with embodiments of the invention. Thus, while there have been shown, described, and pointed out fundamental novel features of the invention, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:

1. A system for wind turbine control, the system comprising:
   a state dependent quadratic regulator (SDQR) control unit including a processor unit and a memory unit, the memory unit containing executable instructions;
   a linear quadratic regulator (LQR) configured to generate control acceleration commands and implement the commands via actuators to control wind turbine speed and wind turbine power regulation, wherein the control acceleration commands are calculated as follows:

$$\delta \ddot{u} = K(t) \delta x_{aug}$$

$$\delta x_{aug} = x_{aug} - x_{aug}^{op}$$

where K(t) is the time-varying LQR gain calculated by solving an algebraic Riccati equation for sampling time periods;
   where X is a state vector (turbine degrees of freedom) in a wind turbine dynamic state space model;
   where $X_{aug}$ is the state vector X augmented with the states of dynamic models of the actuators; and
   where $X_{aug}^{op}$ is the current operating point for $X_{aug}$ (wind turbine and actuators combined, which is time-varying and updated in each sampling time; and
   an actuator dynamic model configured to compute a gain value for the LQR at predetermined real-time sampling intervals based on current operating point values for the wind turbine; and
   a wind turbine model to augment the actuator dynamic model.

2. The system of claim 1, the actuator dynamic model configured to model pitch and torque actuators of the wind turbine.

3. The system of claim 1, the actuator dynamic model configured to apply a discrete-time algebraic Riccati equation linear quadratic regulator to compute the gain value in real-time.

4. The system of claim 1, the LQR configured to regulate the wind turbine speed and the wind turbine power in a range around certain levels or at set-points received as input to the control unit.

5. The system of claim 1, including, the wind turbine model including an analytical linearization model and at least one precomputed linear model.

6. The system of claim 5, including the precomputed linear model selected from a model bank of precomputed linear models, the selection based on a real-time scheduling operation.

7. The system of claim 6, the scheduling operation based on an estimate of disturbance parameters influencing the wind turbine at about the time of scheduling.

8. The system of claim 5, including the analytical linearization model computed using an online linearization operation in real-time at time intervals during operation of the wind turbine, the online linearization based on the current operating point values for the wind turbine present at about the time of linearization.

9. The system of claim 1, wherein the control acceleration commands are calculated using the LQR gain value calculated by solving an algebraic Riccati equation for sampling time periods.

10. A method of generating wind turbine control commands, the method comprising:
    augmenting an actuator dynamic model by employing a wind turbine model;
    computing a gain value for a linear quadratic regulator (LQR) in real-time at predetermined real-time sampling intervals by the actuator dynamic model, based on current operating point values for the wind turbine;

generating control acceleration commands for wind turbine speed and wind turbine power regulation by the LQR, wherein the control acceleration commands are calculated as follows:

$$\delta\ddot{u}=K(t)\delta x_{aug}$$

$$\delta x_{aug}=x_{aug}-x_{aug}^{op}$$

where K(t) is the time-varying LQR gain calculated by solving an algebraic Riccati equation for sampling time periods;

where X is a state vector (turbine degrees of freedom) in a wind turbine dynamic state space model;

where $x_{aug}^{op}$ is the state vector X augmented with the states of dynamic models of the actuators; and;

where $x_{aug}^{op}$ is the current operating point for $x_{aug}$ (wind turbine and actuators combined, which is time-varying and updated in each sampling time; and a state feedback controller weighting the control acceleration commands by applying a plant bank model.

11. The method of claim 10, the gain value computation augmented by modeling pitch and torque actuators of the wind turbine.

12. The method of claim 10, applying a discrete-time algebraic Riccati equation linear quadratic regulator to compute the gain value in real-time.

13. The method of claim 10, regulating the wind turbine speed and the wind turbine power in a range around certain levels or at set-points received as input to the control unit.

14. The method of claim 10, the wind turbine model including an analytical linearization model evaluated online at every sampling time based on the online operating point and at least one precomputed linear model.

15. The method of claim 14, including selecting the precomputed linear model from a model bank of precomputed linear models, the selection based on a real-time scheduling operation.

16. The method of claim 15, including basing the scheduling operation on an estimate of disturbance parameters influencing the wind turbine at about the time of scheduling.

17. The method of claim 10, including tuning parameters of the LQR by performing one of an implicit model following approach and a simulation-based approach.

18. The method of claim 17, the implicit model following approach including:
selecting a desired closed-loop dynamic model; and
tuning the LQR to achieve the prescribed closed-loop dynamics.

19. The method of claim 17, the simulation-based approach including tuning the LQR using closed-loop simulations and performance evaluations, the simulations and evaluations based on sensitivities and trial and error.

20. A system comprising:
a wind turbine including at least one pitch actuator, a torque actuator, and a control system, the control system in communication with the at least one pitch actuator and the torque actuator;
the control system including:
a state dependent quadratic regulator (SDQR) control unit including a processor unit and a memory unit, the memory unit containing executable instructions;
a linear quadratic regulator (LQR) configured to generate control acceleration commands and implement the commands via actuators to control wind turbine speed and wind turbine power regulation, the LQR implementing unconstrained model predictiv control by generating the control acceleration commands for a finite horizon that accounts for time varying dynamics in a future time window, wherein the control acceleration commands are calculated as follows:

$$\delta\ddot{u}=K(t)\delta x_{aug}$$

$$\delta x_{aug}=x_{aug}-x_{aug}^{op}$$

where K(t) is the time-varying LQR gain calculated by solving an algebraic Riccati equation for sampling time periods;
where X is a state vector (turbine degrees of freedom) in a wind turbine dynamic state space model;
where $x_{aug}$ is the state vector X augmented with the states of dynamic models of the actuators; and;
where $x_{aug}^{op}$ is the current operating point for $x_{aug}$ (wind turbine and actuators combined, which is time-varying and updated in each sampling time;
an actuator dynamic model configured to compute a gain value for the LQR at predetermined real-time sampling intervals based on current operating point values for the wind turbine; and
a wind turbine model to augment the actuator dynamic model, the wind turbine model including both an analytical linearization model and at least one precomputed linear model.

* * * * *